(12) United States Patent
Wang et al.

(10) Patent No.: US 7,504,018 B2
(45) Date of Patent: Mar. 17, 2009

(54) ELECTROCHEMICAL METHOD FOR ECMP POLISHING PAD CONDITIONING

(75) Inventors: You Wang, Cupertino, CA (US); Stan D. Tsai, Fremont, CA (US); Lakshmanan Karuppiah, San Jose, CA (US); Jie Diao, San Jose, CA (US); Renhe Jia, Berkeley, CA (US); Alpay Yilmaz, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 171 days.

(21) Appl. No.: 11/554,928

(22) Filed: Oct. 31, 2006

(65) Prior Publication Data

US 2007/0095677 A1 May 3, 2007

Related U.S. Application Data

(60) Provisional application No. 60/732,108, filed on Oct. 31, 2005.

(51) Int. Cl.
*C25F 7/00* (2006.01)
*C25F 3/16* (2006.01)

(52) U.S. Cl. .................................. 205/644; 205/640

(58) Field of Classification Search ................ 205/644, 205/640
See application file for complete search history.

(56) References Cited

U.S. PATENT DOCUMENTS

| | | | |
|---|---|---|---|
| 4,169,337 A | 10/1979 | Payne | |
| 4,588,421 A | 5/1986 | Payne | |
| 4,752,628 A | 6/1988 | Payne | |
| 4,867,757 A | 9/1989 | Payne | |
| 5,081,051 A | 1/1992 | Mattingly et al. | |
| 5,264,010 A | 11/1993 | Brancaleoni et al. | |
| 5,384,986 A | 1/1995 | Hirose et al. | |
| 5,614,444 A | 3/1997 | Farkas et al. | |
| 5,643,067 A | 7/1997 | Katsuoka et al. | |
| 5,662,769 A | 9/1997 | Schonauer et al. | |
| 5,700,383 A | 12/1997 | Feller et al. | |
| 5,738,574 A | 4/1998 | Tolles et al. | |
| 5,738,800 A | 4/1998 | Hosali et al. | |
| 5,756,398 A | 5/1998 | Wang et al. | |
| 5,769,689 A | 6/1998 | Cossaboon et al. | |

(Continued)

FOREIGN PATENT DOCUMENTS

EP 0620293 10/1994

(Continued)

OTHER PUBLICATIONS

Brusic, V., et al., "Copper Corrosion With and Without Inhibitors", Electochem. Soc., 138:8, 2253-2259, Aug. 1991.

(Continued)

*Primary Examiner*—Harry D Wilkins, III
*Assistant Examiner*—Nicholas A. Smith
(74) *Attorney, Agent, or Firm*—Petterson & Sheridan

(57) ABSTRACT

A method for conditioning an Ecmp pad is provided. In one embodiment, a method for electrochemically processing a substrate includes the steps of providing an electrical bias voltage between the top surface of the pad assembly and an electrode, and electrochemically removing contaminants from the top surface of the pad.

2 Claims, 4 Drawing Sheets

U.S. PATENT DOCUMENTS

| | | |
|---|---|---|
| 5,785,585 A | 7/1998 | Manfredi et al. |
| 5,835,137 A | 11/1998 | McKeown |
| 5,840,629 A | 11/1998 | Carpio |
| 5,876,508 A | 3/1999 | Wu et al. |
| 5,911,835 A | 6/1999 | Lee et al. |
| 5,932,486 A | 8/1999 | Cook et al. |
| 5,938,507 A | 8/1999 | Ko et al. |
| 5,958,794 A | 9/1999 | Bruxvoort et al. |
| 5,981,454 A | 11/1999 | Small |
| 6,033,993 A | 3/2000 | Love, Jr. et al. |
| 6,042,741 A | 3/2000 | Hosali et al. |
| 6,046,110 A | 4/2000 | Hirabayashi et al. |
| 6,054,379 A | 4/2000 | Yau et al. |
| 6,063,306 A | 5/2000 | Kaufman et al. |
| 6,068,879 A | 5/2000 | Pasch |
| 6,074,949 A | 6/2000 | Schonauer et al. |
| 6,077,337 A | 6/2000 | Lee |
| 6,083,840 A | 7/2000 | Mravic et al. |
| 6,096,652 A | 8/2000 | Watts et al. |
| 6,117,775 A | 9/2000 | Kondo et al. |
| 6,117,783 A | 9/2000 | Small et al. |
| 6,123,088 A | 9/2000 | Ho |
| 6,156,661 A | 12/2000 | Small |
| 6,162,301 A | 12/2000 | Zhang et al. |
| 6,165,956 A | 12/2000 | Zhang et al. |
| 6,190,236 B1 | 2/2001 | Drill |
| 6,190,243 B1 | 2/2001 | Wada et al. |
| 6,244,935 B1 | 6/2001 | Birang et al. |
| 6,273,797 B1 | 8/2001 | Becker et al. |
| 6,274,059 B1 | 8/2001 | Krusell et al. |
| 6,348,725 B2 | 2/2002 | Cheung et al. |
| 6,355,075 B1 | 3/2002 | Ina et al. |
| 6,355,153 B1 | 3/2002 | Uzoh et al. |
| 6,432,826 B1 | 8/2002 | Emami et al. |
| 6,436,302 B1 | 8/2002 | Li et al. |
| 6,451,699 B1 | 9/2002 | Sun et al. |
| 6,524,167 B1 | 2/2003 | Tsai et al. |
| 6,541,697 B1 | 4/2003 | Georg et al. |
| 6,569,349 B1 | 5/2003 | Wang et al. |
| 6,572,446 B1 | 6/2003 | Osterheld et al. |
| 6,572,466 B1 | 6/2003 | Del Ser Gonzalez |
| 6,593,239 B2 | 7/2003 | Kaufman et al. |
| 6,593,282 B1 | 7/2003 | Li et al. |
| 6,653,242 B1 | 11/2003 | Sun et al. |
| 6,656,842 B2 | 12/2003 | Li et al. |
| 6,709,314 B2 | 3/2004 | Li et al. |
| 6,709,316 B1 | 3/2004 | Sun et al. |
| 6,736,952 B2 | 5/2004 | Emesh et al. |
| 6,846,227 B2 | 1/2005 | Sato et al. |
| 6,899,592 B1 | 5/2005 | Kojima et al. |
| 7,041,599 B1 | 5/2006 | Li et al. |
| 2001/0004538 A1 | 6/2001 | Li et al. |
| 2001/0052351 A1 | 12/2001 | Brown |
| 2002/0148169 A1 | 10/2002 | Emani et al. |
| 2003/0114004 A1 | 6/2003 | Sato et al. |
| 2004/0023602 A1 | 2/2004 | Maloney et al. |
| 2005/0000801 A1* | 1/2005 | Wang et al. .................. 204/267 |
| 2005/0173259 A1* | 8/2005 | Mavliev et al. .............. 205/645 |
| 2005/0194681 A1* | 9/2005 | Hu et al. ...................... 257/737 |
| 2006/0032749 A1 | 2/2006 | Liu et al. |
| 2006/0046623 A1 | 3/2006 | Wang et al. |

FOREIGN PATENT DOCUMENTS

| | | |
|---|---|---|
| EP | 0859407 | 8/1998 |
| EP | 0913442 | 5/1999 |
| FR | 2722511 | 1/1996 |
| WO | WO 93/10277 | 5/1993 |
| WO | WO 98/49723 | 11/1998 |
| WO | WO 99/46353 | 9/1999 |
| WO | WO 00/30159 | 5/2000 |
| WO | WO 00/36037 | 6/2000 |
| WO | WO 00/49647 | 8/2000 |
| WO | WO 00/53691 | 9/2000 |
| WO | WO 00/59029 | 10/2000 |

OTHER PUBLICATIONS

U.S. Appl. No. 11/327,527, filed Aug. 11, 2006, entitled "Fully Conductive Pad for Electrochemical Mechanical Processing".

PCT International Search Report and Written Opinion dated Jul. 8, 2008 for International Application No. PCT/US2006/60346.

* cited by examiner

US 7,504,018 B2

ELECTROCHEMICAL METHOD FOR ECMP POLISHING PAD CONDITIONING

CROSS-REFERENCE TO RELATED APPLICATIONS

This application claims benefit of U.S. provisional patent application Ser. No. 60/732,108 (APPM/010655), filed Oct. 31, 2005, which is herein incorporated by reference.

BACKGROUND OF THE INVENTION

1. Field of the Invention

Embodiments of the present invention generally relate to methods and apparatus for conditioning a conductive polishing pad.

2. Description of the Related Art

Electrochemical Mechanical Processing (Ecmp) is a technique used to remove conductive materials from a substrate surface by electrochemical dissolution while concurrently polishing the substrate with reduced mechanical abrasion as compared to conventional Chemical Mechanical Polishing (CMP) processes. Ecmp systems may generally be adapted for deposition of conductive material on the substrate by reversing the polarity of the bias applied between the substrate and an electrode. Electrochemical dissolution is performed by applying a bias between a cathode and a substrate surface to remove conductive materials from the substrate surface into a surrounding electrolyte. The bias may be applied to the substrate surface by a conductive contact disposed on or through a polishing material upon which the substrate is processed. The polishing material may be, for example, a conductive polishing pad disposed on a platen. A mechanical component of the polishing process is performed by providing relative motion between the substrate and the polishing material that enhances the removal of the conductive material from the substrate.

The conductive polishing pad is an important aspect of the Ecmp process. The conductive polishing pad must have the appropriate mechanical properties for substrate planarization while minimizing the generation of defects in the substrate during polishing. Such defects may be scratches in the substrate surface caused by raised areas of the pad or by polishing by-products disposed on the surface of the pad, such as abraded portions of the pad, agglomerations of abrasive particles from a polishing slurry, removed materials from the substrate, and the like. The conductive polishing pad generally deteriorates naturally during polishing due to wear and/or accumulation of polishing by-products on the pad surface. Thus, the pad surface must periodically be refreshed, or conditioned to restore the performance of the pad.

Conventionally, an abrasive conditioning disk is used to work the top layer of the pad surface into a state that possesses desirable polishing results. However, mechanical conditioning has an adverse affect on the pad lifetime. Additionally, abrasive particles which may come free from the conditioning disk during conditioning contribute to scratches and defect generation on the substrate surface. Some conductive polishing pads withstand conditioning by abrasion relatively well. However, other conductive polishing pads are much more sensitive to conditioning by abrasion due to their low thickness or fragility. Conditioning these pads by abrasion may damage the pad and/or may severely reduce the pad lifetime, adding to the time and cost of production.

Another factor affecting the usable life of conductive polishing pads is the formation of oxides on the conductive pad surface, for example, the formation of tin oxide on the surface of a pad containing tin metal. Also affecting the usable life of conductive polishing pads is conductive material by-product contamination, such as tungsten and copper by-products, from conductive material polishing processes. During Ecmp of conductive materials, copper by-products will precipitate out of the electrolyte solution. The precipitates will then contaminate the polishing pad as well as other areas of the polishing tool, including the polishing head, the platen, the conditioning head, among others. This precipitate does not dissolve in de-ionized water (DI water) and makes operation and maintenance of the polishing pad and tool difficult.

Therefore, there is a need for an improved method for conditioning conductive polishing pads.

SUMMARY OF THE INVENTION

Embodiments of the present invention generally provide methods for conditioning a conductive polishing pad.

Embodiments of the invention generally provide a method for in-situ conditioning of a pad used for electropolishing a substrate having an exposed conductive layer while positioned on a platen. A first substrate is placed on the platen. The first substrate is contacted with a surface of the pad. An electrochemical process is performed on the conductive layer of the first substrate. The first substrate is removed from the platen. A negative electrical bias voltage is provided between the surface of the pad and an electrode for a time period. Contaminants are electrochemically removed from the pad. A second substrate is placed on the platen.

In another embodiment a method for in-situ conditioning of a pad used for electropolishing a substrate having an exposed conductive layer while positioned on a platen is provided. A negative bias voltage is applied between the top surface of the pad and an electrode. Contaminants are electrochemically removed from the top surface of the pad.

In another embodiment a method for in-situ conditioning of a pad used for electropolishing a substrate having an exposed conductive layer while positioned on a platen is provided. A target removal current for conditioning the pad is determined. A removal current is applied to the pad. The removal current is measured. The measured removal current is compared to the target removal current. The removal current is adjusted to achieve the targeted removal current for removal of contaminants from the top surface of the pad. When the targeted removal current is achieved, an instantaneous voltage is fixed.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

Figure 1:
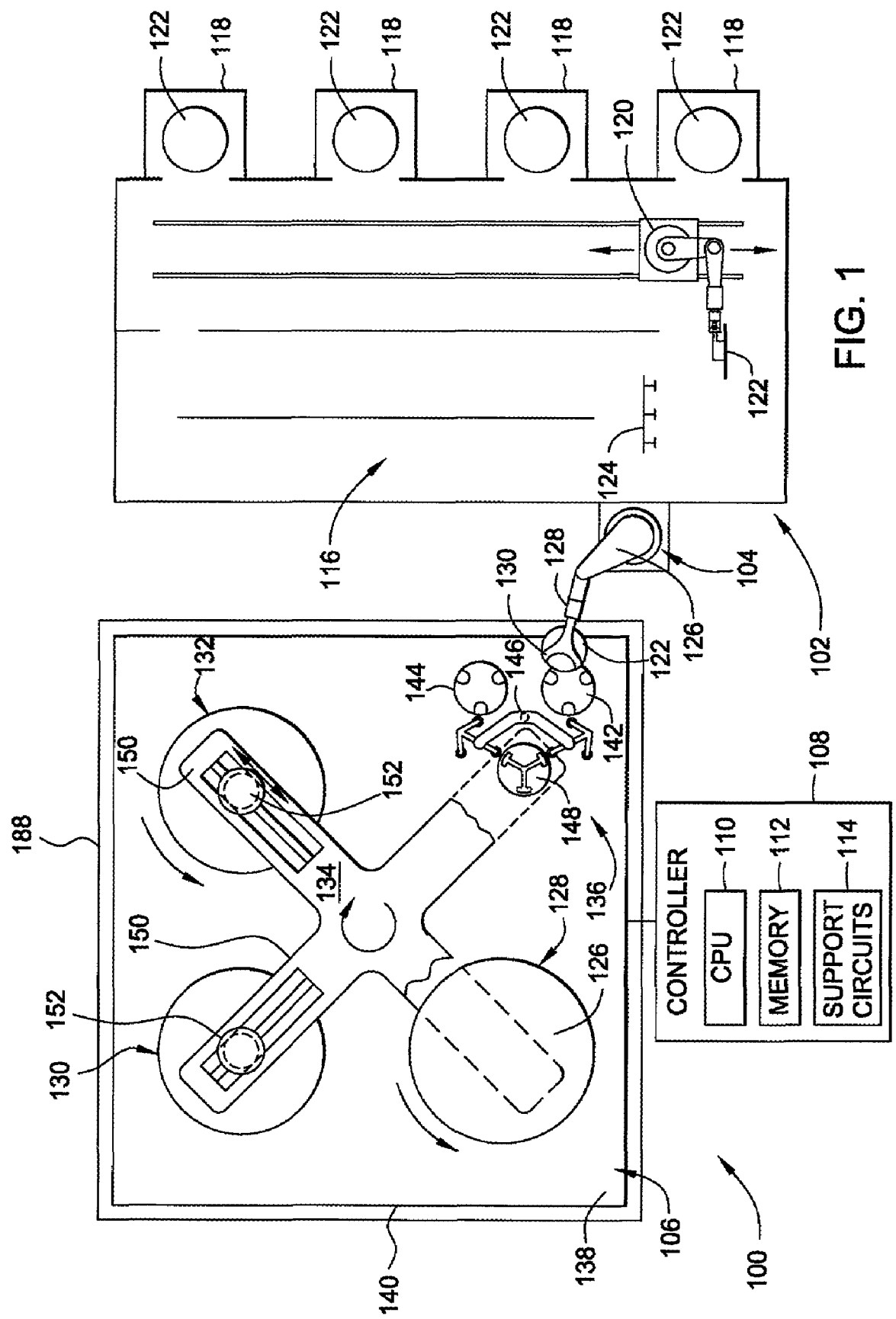
FIG. 1 is a plan view of an electrochemical mechanical planarizing system.

To facilitate understanding, identical reference numerals have been used, where possible, to designate identical elements that are common to the figures. It is contemplated that elements and/or process steps of one embodiment may be beneficially incorporated in other embodiments without additional recitation.

DETAILED DESCRIPTION

Embodiments of the present invention provide methods and apparatus for conditioning a conductive pad. Although the embodiments disclosed below focus primarily on conditioning fully conductive pads comprising tin, it is contemplated that the teachings disclosed herein may be used to condition other conductive pads comprising other conductive materials.

As used herein, the term "electrochemical mechanical polishing" (Ecmp) generally refers to planarizing a substrate by the application of electrochemical activity, mechanical activity, and chemical activity to remove material from a substrate surface.

As used herein, the term "electropolishing" generally refers to planarizing a substrate by the application of electrochemical activity.

As used herein, the term "anodic dissolution" generally refers to the application of an anodic bias to a substrate directly or indirectly which results in the removal of conductive material from a substrate surface and into a surrounding polishing composition.

As used herein, the term "polishing composition" generally refers to a composition that provides ionic conductivity, and thus, electrical conductivity, in a liquid medium, which generally comprises materials known as electrolyte components.

As used herein, the term "substrate" generally refers to any substrate or material surface formed on a substrate upon which film processing is performed. For example, a substrate on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers and patterned or non-patterned wafers.

The electrochemical mechanical polishing process may be performed in a process apparatus, such as a platform having one or more polishing stations adapted for electrochemical mechanical polishing processes. The one or more polishing stations may be adapted to perform conventional chemical mechanical polishing. A platen for performing an electrochemical mechanical polishing process may include a polishing article, a first electrode, and a second electrode, wherein the substrate is in electrical contact with the second electrode. An example of a suitable system is the Reflexion Lk Ecmp™ processing system, commercially available from Applied Materials, Inc., of Santa Clara, Calif. The following apparatus description is illustrative and should not be construed or interpreted as limiting the scope of the invention.

Apparatus

FIG. 1 is a plan view of one embodiment of a planarization system 100 having an apparatus for electrochemically processing a substrate. The exemplary system 100 generally comprises a factory interface 102, a loading robot 104, and a planarizing module 106. The loading robot 104 is disposed proximate the factory interface 102 and the planarizing module 106 to facilitate the transfer of substrates 122 therebetween.

A controller 108 is provided to facilitate control and integration of the modules of the system 100. The controller 108 comprises a central processing unit (CPU) 110, a memory 112, and support circuits 114. The controller 108 is coupled to the various components of the system 100 to facilitate control of, for example, the planarizing, cleaning, and transfer processes.

The factory interface 102 generally includes a cleaning module 116 and one or more wafer cassettes 118. An interface robot 120 is employed to transfer substrates 122 between the wafer cassettes 118, the cleaning module 116 and an input module 124. The input module 124 is positioned to facilitate transfer of substrates 122 between the planarizing module 106 and the factory interface 102 by grippers, for example vacuum grippers or mechanical clamps.

The planarizing module 106 includes at least a first electrochemical mechanical planarizing (Ecmp) station 128, disposed in an environmentally controlled enclosure 188. Examples of planarizing modules 106 that can be adapted to benefit from the invention include MIRRA®, MIRRA MESA™, REFLEXION®, REFLEXION® LK, and REFLEXION LK Ecmp™ Chemical Mechanical Planarizing Systems, all available from Applied Materials, Inc. of Santa Clara, Calif. Other planarizing modules, including those that use processing pads, planarizing webs, or a combination thereof, and those that move a substrate relative to a planarizing surface in a rotational, linear or other planar motion may also be adapted to benefit from the invention.

In the embodiment depicted in FIG. 1, the planarizing module 106 includes the first Ecmp station 128, a second Ecmp station 130, and a third Ecmp station 132. Bulk removal of conductive material disposed on the substrate 122 may be performed through an electrochemical dissolution process at the first Ecmp station 128. After the bulk material removal at the first Ecmp station 128, the remaining conductive material is removed from the substrate at the second Ecmp station 130 through a multi-step electrochemical mechanical process, wherein part of the multi-step process is configured to remove residual conductive material. It is contemplated that more than one Ecmp station may be utilized to perform the multi-step removal process after the bulk removal process performed at a different station. Alternatively, each of the first and second Ecmp stations 128, 130 may be utilized to perform both the bulk and multi-step conductive material removal on a single station. It is also contemplated that all Ecmp stations (for example 3 stations of the module 106 depicted in FIG. 1) may be configured to process the conductive layer with a two step removal process, and to condition the conductive pad as described in more detail below.

The exemplary planarizing module 106 also includes a transfer station 136 and a carousel 134 that are disposed on an upper or first side 138 of a machine base 140. In one embodiment, the transfer station 136 includes an input buffer station 142, an output buffer station 144, a transfer robot 146, and a load cup assembly 148. The input buffer station 142 receives substrates from the factory interface 102 by means of the loading robot 104. The loading robot 104 is also utilized to return polished substrates from the output buffer station 144 to the factory interface 102. The transfer robot 146 is utilized to move substrates between the buffer stations 142, 144 and the load cup assembly 148.

In one embodiment, the transfer robot 146 includes two gripper assemblies, each having pneumatic gripper fingers that hold the substrate by the substrate's edge. The transfer robot 146 may simultaneously transfer a substrate to be processed from the input buffer station 142 to the load cup assembly 148 while transferring a processed substrate from the load cup assembly 148 to the output buffer station 144. An example of a transfer station that may be used to advantage is described in U.S. Pat. No. 6,156,124, issued Dec. 5, 2000 to Tobin, which is herein incorporated by reference in its entirety.

The carousel 134 is centrally disposed on the base 140. The carousel 134 typically includes a plurality of arms 150, each supporting a planarizing head assembly 152. Two of the arms 150 depicted in FIG. 1 are shown in phantom such that the transfer station 136 and a planarizing surface 126 of the first Ecmp station 128 may be seen. The carousel 134 is indexable such that the planarizing head assemblies 152 may be moved between the planarizing stations 128, 130, 132 and the transfer station 136. One carousel that may be utilized to advantage is described in U.S. Pat. No. 5,804,507, issued Sep. 8, 1998 to Perlov, et al, which is hereby incorporated by reference in its entirety.

Figure 2:
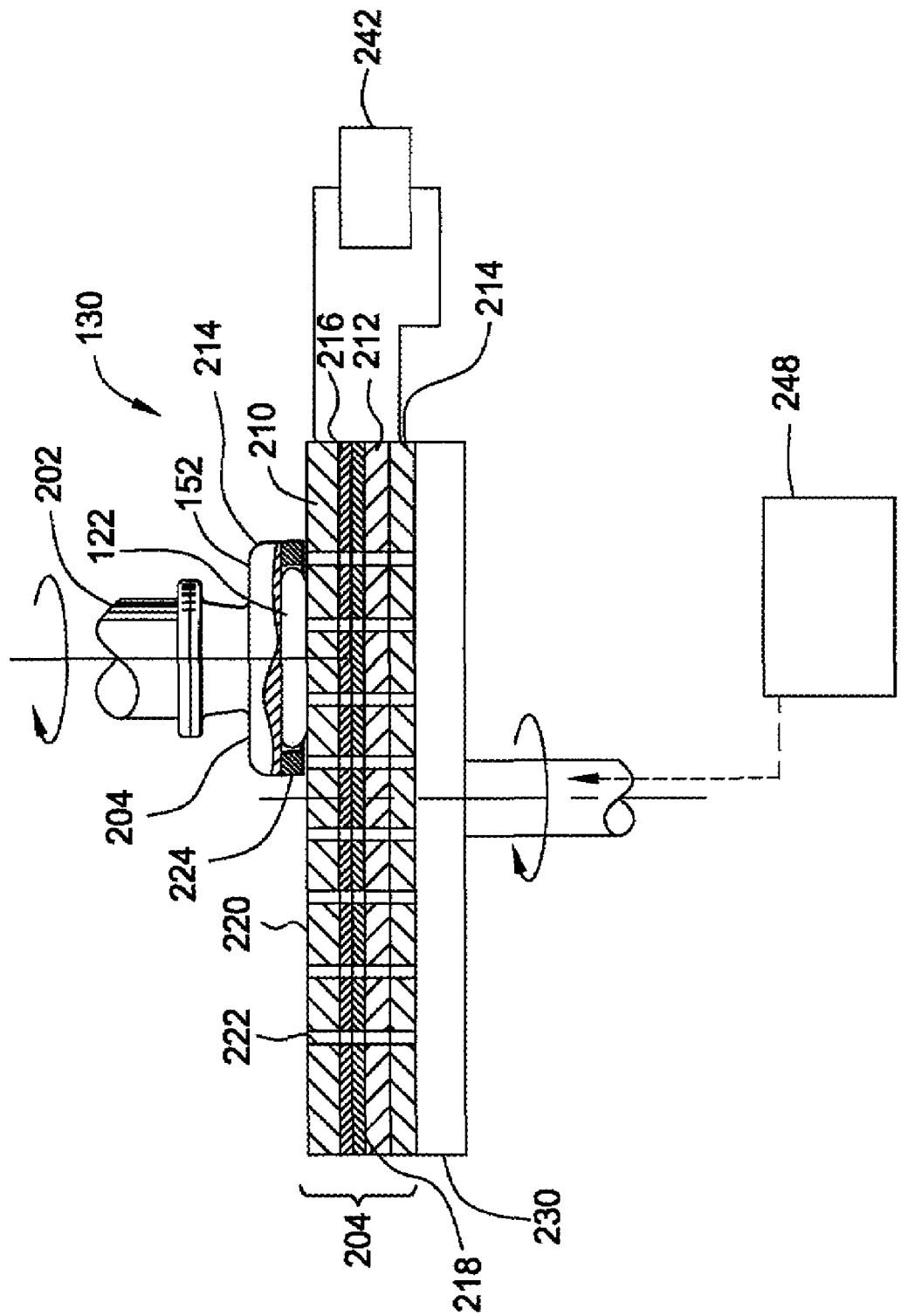
FIG. 2 is a sectional view of one embodiment of a electrochemical mechanical planarizing (Ecmp) station of the system of FIG. 1.

FIG. 2 is a sectional view of one embodiment of the second Ecmp station 130. The first and third Ecmp stations 128, 132 may be configured similarly. The second Ecmp station 130 generally includes a platen assembly 230 that supports a fully conductive processing pad assembly 204. The platen assembly 230 may be configured to deliver electrolyte through the processing pad assembly 204, or the platen assembly 230 may have a fluid delivery arm (not shown) disposed adjacent thereto configured to supply electrolyte to a planarizing surface of the processing pad assembly 204. The platen assembly 230 includes at least one of a meter or sensor to facilitate endpoint detection.

In one embodiment, the processing pad assembly 204 includes interposed pad 212 sandwiched between a conductive pad 210 and an electrode 214. The conductive pad 210 is substantially conductive across its top processing surface and is generally made from a conductive material or a conductive composite (i.e., the conductive elements are dispersed integrally with or comprise the material comprising the planarizing surface), such as a polymer matrix having conductive particles dispersed therein or a conductive coated fabric, among others. The conductive pad 210, the interposed pad 212, and the electrode 214 may be fabricated into a single, replaceable assembly. The processing pad assembly 204 is generally permeable or perforated to allow electrolyte to pass between the electrode 214 and top surface 220 of the conductive pad 210. The processing pad assembly 204 is perforated by apertures 222 to allow electrolyte to flow therethrough.

In one embodiment, the conductive pad 210 comprises a conventional polishing material, such as polymer based pad materials compatible with the process chemistry, examples of which include polyurethane, polycarbonate, fluoropolymers, PTFE, PTFA, polyphenylene sulfide (PPS), or combinations thereof. The conventional polishing material may be coated, doped, or impregnated with a process compatible conductive material and/or particles. Alternatively, the conductive pad 210 may be a conductive polymer, such as conductive filler material disposed in a conductive polymer matrix, such as fine tin particles in a polyurethane binder, or a conductive fabric, such as carbon fibers in a polyurethane binder. In one embodiment, the conductive pad 210 is comprised of a conductive material disposed on a polymer matrix disposed on a conductive fiber, for example, tin particles in a polymer matrix disposed on a woven copper coated polymer. Other conductive materials include stainless steel, aluminum, gold, silver, copper, and nickel, among others.

In another embodiment, the conductive pad 210 comprises removal particles adapted to facilitate material removal from the deposit receiving side of the substrate. In one embodiment, the removal particle are conductive particles, such as particles of tin, copper, nickel, silver, gold, or combinations thereof, in a conductive polymer matrix. In another embodiment, the removal particles are abrasive particles, such as aluminum, ceria, oxides thereof and derivatives thereof, and combinations thereof, in a conductive polymer matrix. In yet another embodiment, the removal particles are a combination of abrasive and conductive particles as described herein and are interspersed within the conductive material.

A conductive foil 216 may additionally be disposed between the conductive pad 210 and the subpad 212. The foil 216 is coupled to a power source 242 and provides uniform distribution of voltage applied by the source 242 across the conductive pad 210. In embodiments not including the conductive foil 216, the conductive pad 210 may be coupled directly, for example, via a terminal integral to the pad 210, to the power source 242. Additionally, the pad assembly 204 may include an interposed pad 218, which, along with the foil 216, provides mechanical strength to the overlying conductive pad 210. Examples of suitable pad assemblies are described in U.S. Pat. No. 6,991,528, issued Jan. 31, 2006, entitled CONDUCTIVE POLISHING ARTICLE FOR ELECTROCHEMICAL MECHANICAL POLISHING, U.S. patent application Ser. No. 10/455,895, filed Jun. 6, 2003, entitled CONDUCTIVE POLISHING ARTICLE FOR ELECTROCHEMICAL MECHANICAL POLISHING, and U.S. patent application Ser. No. 11/327,527, filed Jan. 1, 2005, entitled FULLY CONDUCTIVE PAD FOR ELECTROCHEMICAL MECHNICAL PROCESSING, all of which are hereby incorporated by reference in their entirety.

The power source 242 generally provides a positive electrical bias to the pad 210 during processing. Between planarizing substrates, the power source 242 generally applies a negative bias to the pad 210 to minimize attack on the pad 210 by process chemistries.

The planarizing head assembly 152 generally comprises a drive system 202 coupled to a planarizing head 204. The drive system 202 generally provides at least rotational motion to the planarizing head 204. The planarizing head 204 additionally may be actuated toward the first Ecmp station 128 such that the substrate 122 retained in the planarizing head 204 may be disposed against the planarizing surface 126 of the first Ecmp station 128 during processing. The drive system 202 is coupled to the controller 108 that provides a signal to the drive system 202 for controlling the rotational speed and direction of the planarizing head 204.

In one embodiment, the planarizing head may be a TITAN HEAD™ or TITAN PROFILER™ wafer carrier available from Applied Materials, Inc. of Santa Clara, Calif. Generally, the planarizing head 204 comprises a housing 214 and retaining ring 224 that defines a center recess in which the substrate 122 is retained. The retaining ring 224 circumscribes the substrate 122 disposed within the planarizing head 204 to prevent the substrate from slipping out from under the planarizing head 204 while processing. The retaining ring 224 can be made of plastic materials such as PPS, PEEK, and the like, or conductive materials such as stainless steel, Cu, Au, Pd, and the like, or some combination thereof. It is further contemplated that a conductive retaining ring 224 may be electrically biased to control the electric field during Ecmp. Conductive or biased retaining rings tend to slow the polishing rate proximate the edge of the substrate. It is contemplated that other planarizing heads may be utilized.

The second Ecmp station 130 generally includes a platen assembly 230 that is rotationally disposed on the base 140. The platen assembly 230 is supported above the base 140 by a bearing (not shown) so that the platen assembly 230 may be rotated relative to the base 140. An area of the base 140 circumscribed by the bearing is open and provides a conduit for the electrical, mechanical, pneumatic, control signals and connections communicating with the platen assembly 230.

Conventional bearings, rotary unions and slip rings, collectively referred to as rotary coupler (not shown), are provided such that electrical, mechanical, fluid, pneumatic, control signals and connections may be coupled between the base 140 and the rotating platen assembly 230. The platen assembly 230 is typically coupled to a motor 248 that provides the rotational motion to the platen assembly 230. The motor 248 is coupled to the controller 108 that provides a signal for controlling for the rotational speed and direction of the platen assembly 230.

Method for Conditioning a Conductive Pad

Methods are provided for in-situ conditioning of an Ecmp polishing pad used for electropolishing a substrate having an exposed conductive layer on a platen. The methods may be performed in conjunction with an electrochemical polishing technique.

Figure 3:
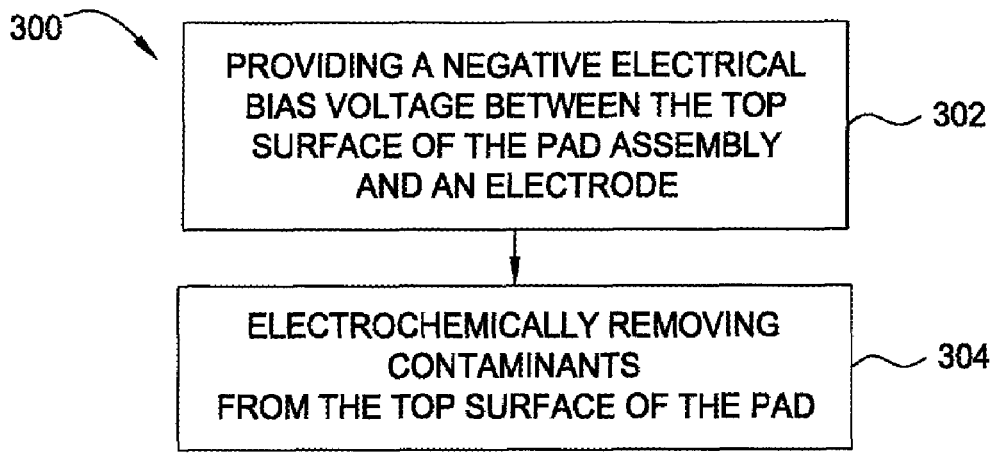
FIG. 3 is a flow diagram of one embodiment of a method for conditioning an Ecmp polishing pad.

FIG. 3 depicts one embodiment of a method 300 for conditioning a pad that may be practiced on the system 100 described above. The method 300 may also be practiced on other electroprocessing systems that are configured to run the methods described below. The method 300 is generally stored in the memory 112 of the controller 108, typically as a software routine. The software routine may also be stored and/or executed by a second CPU (not shown) that is remotely located from the hardware being controlled by the CPU 110.

Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

The method 300 begins at step 302 by providing an electrical bias voltage between the top surface of the pad assembly 204 and the electrode 214. The first processing step 302 is followed at step 304 by electrochemically removing contaminants from a top surface of the pad assembly 204.

In a typical Ecmp process, the power source 242 provides a bias voltage between the top surface of the pad assembly 204 and the electrode 214. The pad assembly 204 is anodically biased and the electrode 214 is cathodically biased. In one embodiment, the voltage is held at a constant magnitude less than about 3.5 volts. In another embodiment where copper is the material being processed, the voltage is held at a constant magnitude less than about 3.0 volts. Electrolyte filling the apertures 222 between the electrode 214 and the substrate 122 provides a conductive path between the power source 242 and substrate 122 to drive an electrochemical mechanical planarizing process that results in the removal of the tungsten material, or other conductive film disposed on the substrate, by an anodic dissolution method. The electrolyte typically includes at least one of sulfuric acid, phosphoric acid, and ammonium citrate.

In one embodiment of the pad conditioning method the first processing step 302 includes reversing the polarity of the pad assembly 204 and the electrode 214. The pad assembly 204 is cathodically biased and the electrode 214 is anodically biased. During the cathodic polarization of the pad, metal oxide reduction, such as tin oxide reduction, and hydrogen evolution occurs on the top surface of the pad assembly 204. These reactions reduce tin oxide to tin metal and also remove precipitates and by-products from the top surface of the pad. The applied voltage magnitude can be varied between 2.0 volts and 3.5 volts. The time duration can be between 5 and 30 seconds depending upon process conditions. This pad conditioning method is preferably performed after a wafer is de-chucked form the pad and before a next wafer is polished.

In another embodiment, the first processing step 302 includes setting a specific current value (thus a specific removal rate) as the targeted removal current for the pad conditioning process. Voltage is then decreased or increased based on feedback from measurement of the current. If the measured current is lower than the targeted removal current, the voltage is increased to get the current close to the target. If the measured current is higher than the targeted removal current, the voltage will be decreased to lower the current. This can be done with a closed loop feedback system, so that the polishing tool can automatically adjust the voltage, leading to the targeted removal rate of contaminants from the top surface of the pad.

In another embodiment, the first processing step 302 further includes fixing an instantaneous voltage as soon as the targeted current is reached in a stabilized state. So from this point forward, the pad conditioning will be done with this constant voltage.

Figure 4:
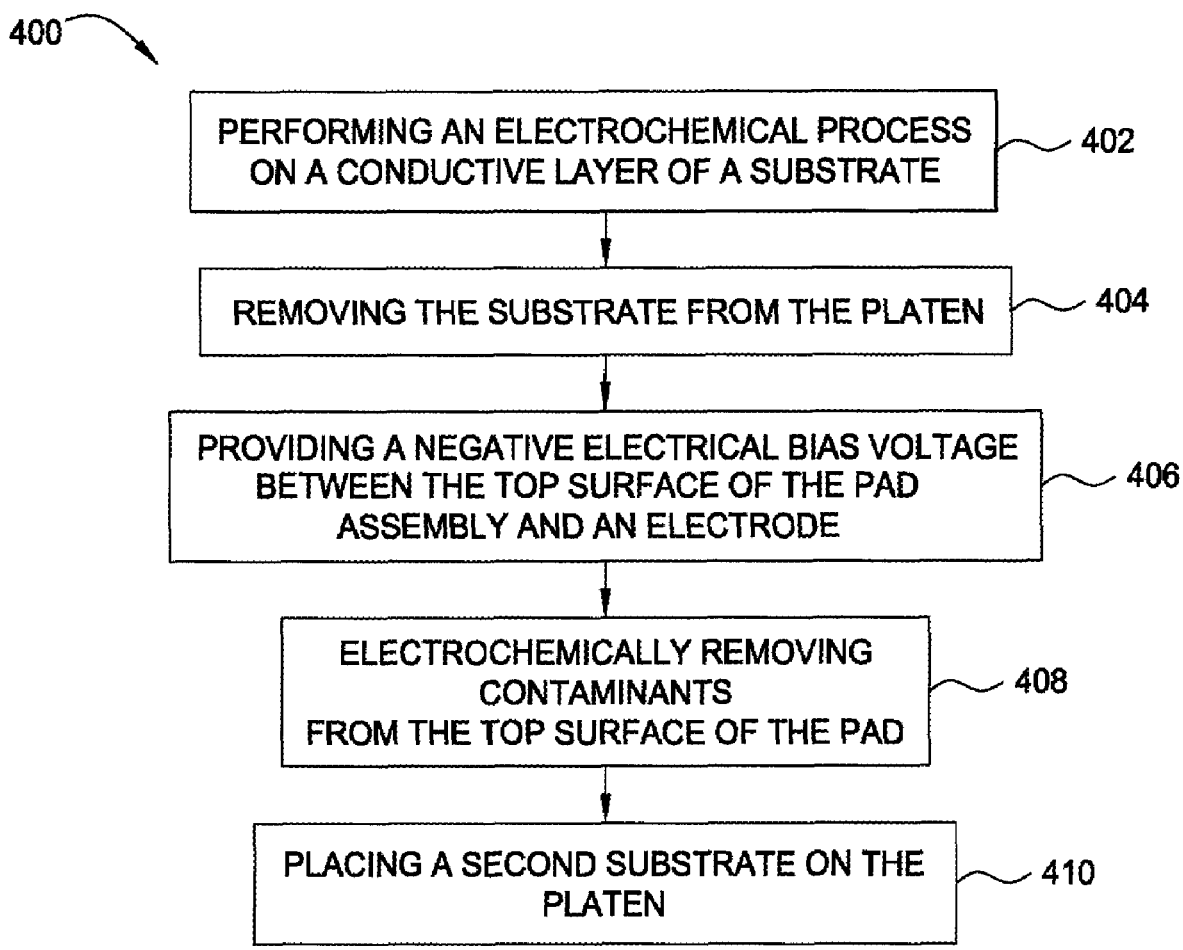
FIG. 4 is a flow diagram of one embodiment of a method for conditioning an Ecmp polishing pad.

FIG. 4 depicts one embodiment of a method 400 for electroprocessing a substrate. The method 400 begins at step 402 where an electrochemical process is performed on a conductive layer of a substrate. The first processing step 402 is followed by step 404 where the substrate is removed from a platen. Next, in step 406, an electrical bias voltage is provided between the top surface of the pad assembly and an electrode. In step 408, contaminants are electrochemically removed from the top pad surface. Finally, in step 410, a second substrate is placed on the platen.

The electrochemical process of step 402 may include processing a substrate having a conductive material layer disposed over features, supplying a polishing composition as described herein to the surface of the substrate, applying a pressure between the substrate and a polishing article, providing relative motion between the substrate and the polishing article, applying a pulse bias between a first electrode and a second electrode in electrical contact with the substrate, and removing at least a portion of the conductive material from the substrate surface.

The removal of excess conductive material, such as tungsten, may be performed in one or more processing steps, for example, a single removal step or a first portion removal step and a second portion removal step. Bulk material is broadly defined herein as any material deposited on the substrate in an amount more than sufficient to substantially fill features formed on the substrate surface. Residual material is broadly defined as any material remaining after one or more bulk or residual polishing process steps. Generally, the first portion removal process is a bulk removal during a first Ecmp step to remove at least about 50% of the conductive layer, preferably at least about 70%, more preferably at least about 80%, for example, at least about 90%. The second portion removal process is a residual removal during a second Ecmp step that removes most, if not all the remaining conductive material disposed on the barrier layer to leave behind the filled plugs.

The bulk removal Ecmp step may be performed on a first polishing platen and the residual removal Ecmp step on a second polishing platen of the same or different polishing apparatus as the first platen. In another embodiment, the residual removal Ecmp step may be performed on the first platen with the bulk removal step. Any barrier material may be removed on a separate platen, such as the third platen in the apparatus described in FIG. 1. For example, the apparatus described above in accordance with the processes described herein may include three platens for removing tungsten material including, for example, a first platen to remove bulk material, a second platen for residual removal, and a third platen for barrier removal, wherein the bulk and the residual processes are Ecmp processes and the barrier removal is a CMP process, or, alternatively, another Ecmp process. In another embodiment, three Ecmp platens may be used to remove bulk material, residual removal, and barrier removal.

In one embodiment, the electrochemical process of step 402 is a bulk removal process in which the conductive layer is a layer of tungsten about 6000-8000 Å thick. The bulk process step 402 can be performed at the first 128, second 130, or third 132 processing stations. The bulk process step 402 generally is terminated when the conductive layer is about 2000 to about 500 Å thick. In another embodiment, the electrochemical process of step 402 is a residual removal process.

After removing the substrate from the platen in step 404, a negative electrical bias voltage is provided between the top surface of the pad assembly and an electrode in step 406. The applied voltage for electrochemical treatment of the pad may be varied between 2.0 V to 3.5 V in relation to the electrode 214. The time duration is generally between about 5 seconds to about 30 seconds. Both voltage and time may vary depending upon the initial process conditions.

In step 408, contaminants are electrochemically removed from the top pad surface. When applying the negative electrical bias of step 406 to the pad, contaminants are electrochemically removed from the surface of the pad by reducing a metal oxide and generating hydrogen on the surface of the pad. For example, if the pad comprises tin, application of the negative electrical bias to the pad surface would reduce tin oxide and generating hydrogen on the surface of the pad. At step 410, a second substrate is place on the platen.

Figure 5:
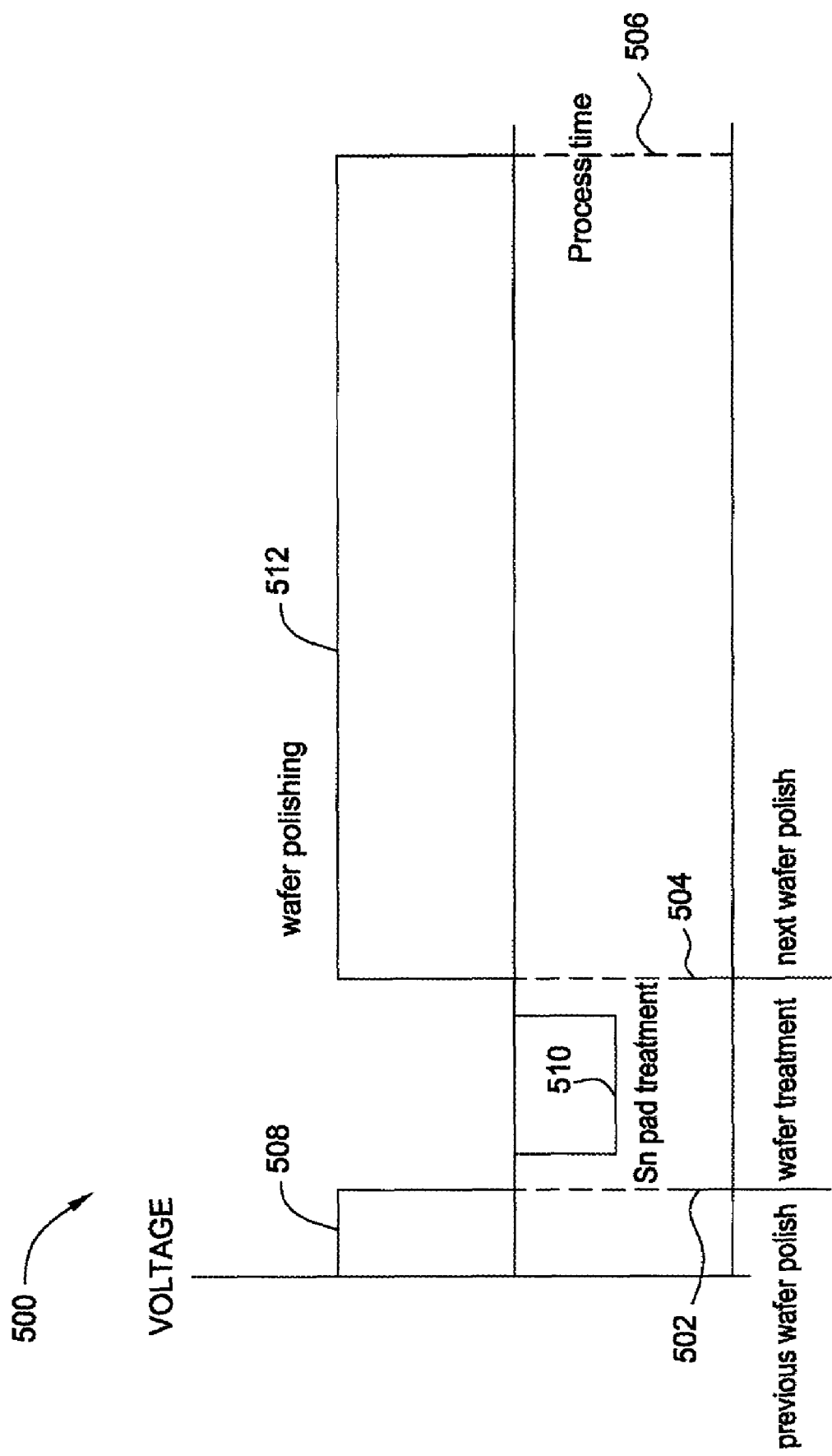
FIG. 5 depicts a graph illustrating voltage verses time for a process sequence of one embodiment of a method for conditioning an Ecmp polishing pad.

FIG. 5 depicts a graph 500 illustrating voltage verses time for a process sequence of one embodiment of in-situ conditioning of a polishing pad. The x-axis represents voltage (volts) and the y-axis represents process time (seconds). Line 502 represents an endpoint for the electrochemical process performed on a first substrate. Line 504 represents a starting point for the electrochemical process performed on a second substrate. Line 506 represents an endpoint for an electrochemical process performed on the second substrate. Line 508 represents the voltage applied to the first substrate during the electrochemical process. Line 510 represents voltage applied to the pad assembly 204 between the electrochemical process performed on the first substrate which ends at the first endpoint 502 and the start point 504 which begins the electrochemical process on the second substrate. Line 512 represents the voltage applied to the pad assembly 204 during the electrochemical process performed on the second substrate. The electrochemical method for treatment of the surface of the pad assembly 204 is implemented during the time period between line 502 after the first substrate is de-chucked and line 504 before the next wafer is polished. During the cathodic polarization of the pad assembly 204, line 510, metal oxide reduction and hydrogen evolution occur on the pad surface of the pad assembly 204 and the metal oxide is reduced to metal and hydrogen is produced. Added precipitates and by-products are also removed from the pad surface.

Thus, the present invention provides an improved method for conditioning conductive polishing pads. The method advantageously facilitates electrochemical conditioning of a conductive pad surface. Utilization of electrochemical conditioning reduces mechanical wearing of the pad surface while minimizing particle generation. Further, the method can be easily integrated into current Ecmp processes. It is contemplated that the method as described by the teachings herein may be utilized to condition other pad surfaces in other substrate processing systems.

While the foregoing is directed to embodiments of the invention, other and further embodiments of the invention may be devised without departing from the basic scope thereof, and the scope thereof is determined by the claims that follow.

The invention claimed is:

1. A method for in-situ conditioning of a pad used for electropolishing a substrate having an exposed conductive layer while on a platen, sequentially comprising:
   determining a target removal current for conditioning of the pad;
   applying a removal current to the pad;
   measuring the removal current;
   comparing the measured removal current to the target removal current;
   adjusting the removal current to achieve the targeted removal current for removal of contaminants from a top surface of the pad; and
   fixing an instantaneous voltage when the targeted removal current is achieved, wherein applying a removal current to the pad comprises applying a negative electrical bias to the pad.

2. The method of claim 1, wherein applying a removal current to the pad comprises electrochemically removing contaminants from the surface of the pad by reducing a metal oxide and generating hydrogen on the surface of the pad.

* * * * *

UNITED STATES PATENT AND TRADEMARK OFFICE
CERTIFICATE OF CORRECTION

PATENT NO. : 7,504,018 B2  Page 1 of 1
APPLICATION NO. : 11/554928
DATED : March 17, 2009
INVENTOR(S) : Wang et al.

It is certified that error appears in the above-identified patent and that said Letters Patent is hereby corrected as shown below:

On the Title Page, Item (56)
In the Attorney, Agent, or Firm:

Please delete "Petterson" and insert --Patterson-- therefor.

Signed and Sealed this

Second Day of June, 2009

JOHN DOLL
*Acting Director of the United States Patent and Trademark Office*